United States Patent [19]

Ando

[11] Patent Number: 5,457,604
[45] Date of Patent: Oct. 10, 1995

[54] SEMICONDUCTOR MODULE DEVICE HAVING A DESIRED ELECTRICAL CIRCUIT CONSTITUTED BY COMBINATION OF SEMINCONDUCTOR DEVICES FORMED ON CIRCUIT BOARDS

[75] Inventor: Masaru Ando, Kamakura, Japan

[73] Assignee: Kabushiki Kaisha Toshiba, Kawasaki, Japan

[21] Appl. No.: 311,034

[22] Filed: Sep. 26, 1994

[30] Foreign Application Priority Data

Sep. 28, 1993 [JP] Japan ................................. 5-241686

[51] Int. Cl.$^6$ ................................................. H05K 7/20
[52] U.S. Cl. ..................... 361/707; 174/16.3; 257/678; 257/692; 257/706; 257/713; 257/724; 361/715; 361/736; 361/784
[58] Field of Search ............................ 174/163; 257/678, 257/686, 692, 706, 712–713, 723, 724, 730; 361/679, 702, 704, 707, 709–710, 715–722, 728, 730, 736, 749, 777, 784

[56] References Cited

U.S. PATENT DOCUMENTS 3,065,384 11/1962 Spruce ..................................... 361/716
3,596,140 7/1971 Walsh ..................................... 361/784
5,347,160 9/1994 Sutrina ..................................... 257/678

Primary Examiner—Gregory D. Thompson
Attorney, Agent, or Firm—Finnegan, Henderson, Farabow, Garrett & Dunner

[57] ABSTRACT

A semiconductor module device according to the present invention includes a disk-shaped DBC circuit board which are divided into, e.g., six sectorial DBC circuit boards. A plurality of semiconductor pellets are arranged in a staggered fashion on each of the sectorial DBC circuit boards. Externally leading electrodes are provided at the respective innermosts of the sectorial DBC circuit boards, and externally leading power terminals, which are connected to the externally leading electrodes, are extracted from the central part of the DBC circuit board. With this constitution, the distances between the externally leading power terminals and the sectorial DBC circuit boards can be minimized, and the distances between the externally leading power terminals and the semiconductor pellets on the sectorial DBC circuit boards can be uniformed, with the result that the efficiency and reliability of the module device can be improved. Since the DBC circuit board is shaped like a disk, it can be protected from breakage due to the stress concentrated when the device is mounted.

3 Claims, 2 Drawing Sheets

SEMICONDUCTOR MODULE DEVICE HAVING A DESIRED ELECTRICAL CIRCUIT CONSTITUTED BY COMBINATION OF SEMINCONDUCTOR DEVICES FORMED ON CIRCUIT BOARDS

BACKGROUND OF THE INVENTION

1. Field of the Invention

The present invention relates to a semiconductor module device having a desired electric circuit constituted by combination of plural semiconductor devices formed on circuit boards and, more specifically, to a three-phase AC motor control module device which can be greatly improved in efficiency and reliability.

2. Description of the Related Art

Conventionally, a three-phase AC motor control module device is the most commonly used among several tens of types of semiconductor module device and serves as an inverter. FIG. 1 shows a circuit arrangement of the three-phase AC motor control module device.

Referring to FIG. 1, the module device comprises six device sections having six IGBTs (Insulated Gate Bipolar Transistors) T1 to T6 and six diodes D1 to D6, respectively. In these device sections, the collectors of the IGBTs T1 to T6 are connected to their corresponding cathodes of the diodes D1 to D6, and the emitters of the IGBTs are connected to their corresponding anodes of the diodes.

In the device sections arranged alongside an input power terminal P (hereinafter referred to as P-side device sections), the collectors of the IGBTs T1 to T3 are connected in common to the input power terminal P. In the device sections arranged alongside an input power terminal N (hereinafter referred to as N-side device sections), the emitters of the IGBTs T4 to T6 are connected in common to the input power terminal N. The emitter of the IGBT T1 of the P-side device section and the collector of the IGBT T4 of the N-side device section are connected to each other, and this connecting point is connected to an output power terminal U. The emitter of the IGBT T2 of the P-side device section and the collector of the IGBT T5 of the N-side device section are connected to each other, and this connecting point is connected to an output power terminal V. The emitter of the IGBT T3 of the P-side device section and the collector of the IGBT T6 of the N-side device section are connected to each other, and this connecting point is connected to an output power terminal W. Gate terminals G1 to G6 for issuing gate signals are connected to the gates of the IGBTs T1 to T6, respectively.

The module device having the above circuit arrangement is likely to require higher and higher power. For example, a module device used in an electric automobile needs a current capacity of 600 to 800 A. Usually, a high-power module device includes a plurality of IGBT pellets and a plurality of diode pellets connected in parallel. A plurality of pairs of IGBT and diode pellets are formed on each device section, thereby satisfying the current capacity.

FIGS. 2A and 2B schematically show a configuration of a high-power module device. In this module device, each of the IGBTs T1 to T6 shown in FIG. 1 is constituted by five IGBT pellets t, and each of the diodes D1 to D6 shown therein is constituted by ten diode pellets d. In other words, both a group of five IGBT pellets t and a group of ten diode pellets d are arranged in parallel to each other to constitute one device section.

The high-power module device shown in FIGS. 2A and 2B will be described more specifically. Three DBC (Direct Bond Copper) circuit boards 102 are soldered onto a body of a heat radiation plate 101. Two device sections each having five IGBT pellets t and ten diode pellets d are arranged in parallel on each of the DBC circuit boards 102. The IGBT and diode pellets t and d are bonded to the electrodes (collector electrodes C, emitter electrodes E, gate electrodes G) formed on each DBC circuit board 102, by means of aluminum wires 103. In this module device, a pair of P-side and N-side device sections is formed on each DBC circuit board 102. For example, as shown in FIG. 2A, the P-side device section of IGBT T1 and diode D1 and N-side device section of IGBT T4 and diode D4, the p-side device section of IGBT T2 and diode D2 and N-side device section of IGBT T5 and diode D5, and the P-side device section of IGBT T3 and diode D3 and N-side device section of IGBT T6 and diode D6 are formed on the respective DBC circuit boards 102.

The DBC circuit boards 102 are surrounded by a resin case 104 adhered to the heat radiation plate 101. A resin cover 107 is fixed onto the resin case 104 so as to cover the upper surfaces of the DBC circuit boards 102. Externally leading power terminals 105 and 106 (corresponding to the input power terminals P and N) are integrally formed in the central part of the cover 107. Output power terminals U, V and W are also attached to the cover 107 (not shown in FIG. 2B). Further, a plurality of screw holes 108 for mounting the module device, are formed outside the resin case 104 on the heat radiation plate 101.

In the module device having the above configuration, externally leading electrodes (not shown) of the DBC circuit boards 102 have to be electrically connected to one another in order to connect the respective device sections and the externally leading power terminals 105 and 106. Conventionally, this connection is attained by metallic jumper wires (not shown) or by elongating the externally leading power terminals 105 and 106. However, in the module device described above, the externally leading power terminals 105 and 106 are located in substantially the central part of the module device, though the DBC circuit boards 102 are arranged in a row. Therefore, the distances between the power terminals 105 and 106 and the respective pellets t and d vary from one another, resulting in a difference in electrical resistance and inductance between the pellets t and d. If the connection of the externally leading electrodes between the DBC circuit boards 102 is performed by elongating the power terminals 105 and 106, the module device is increased in size and accordingly the power terminals are increased in length. As a result, the electrical resistance and inductance between the power terminals 105 and 106 and each of the DBC circuit boards 102, is heightened.

The conventional module device as described above has to be improved in efficiency and reliability since it has the drawback wherein, when the externally leading power terminals 105 and 106 are extracted together from one spot of the module device, the electrical resistance and inductance between the externally leading power terminals 105 and 106 and each of the circuit boards 102 are increased, and a difference in electrical resistance and inductance occurs between the respective pellets. In particular, the high-power module device is influenced by its internal electrical resistance and inductance, in view of electrical characteristics. If the electrical resistance and inductance increase, the efficiency of the pellets is lowered, thereby causing a malfunction in a signal system.

Furthermore, since, in the conventional module device, the DBC circuit boards 102 are shaped rectangularly, stress is easy to concentrate upon those angular portions of the DBC circuit boards 102 which are in the vicinity of the screw holes 108. Therefore, the device has a drawback of easily causing a crack in the DBC circuit boards 102 when it is fastened by an air driver.

SUMMARY OF THE INVENTION

A first object of the present invention is to provide a semiconductor module device capable of reducing electrical resistance and inductance between externally leading terminals and circuit boards and virtually uniforming variations in electrical resistance and inductance between semiconductor devices, thereby greatly improving in efficiency and reliability.

A second object of the present invention is to provide a semiconductor module device capable of preventing a crack from being caused in the vicinity of mounting holes by stress when the device is mounted.

The above objects are attained as follows.

A semiconductor module device according to one aspect of the present invention includes a desired electrical circuit constituted by combining a plurality of semiconductor devices formed on at least one circuit board, wherein the plurality of semiconductor devices are arranged radially on the circuit board, and externally leading terminals are extracted from a central part of the circuit board.

A semiconductor module device according to another aspect of the present invention comprises:

a heat radiation plate;

a disk-shaped circuit board formed on the heat radiation plate with an insulator interposed therebetween;

a plurality of semiconductor devices arranged radially on the disk-shaped circuit board, and constituting a desired electrical circuit together with the disk-shaped circuit board;

externally leading electrodes provided at an innermost of the disk-shaped circuit board; and externally leading terminals which are located at a central part of the disk-shaped circuit board so as to correspond to the externally leading electrodes.

A semiconductor module device according to still another aspect of the present invention, comprises:

a substantially rectangular heat radiation plate;

a disk-shaped circuit board formed on the heat radiation plate with an insulator interposed therebetween and divided into a plurality of equal-sized sectorial circuit boards;

a plurality of semiconductor devices arranged in a staggered fashion on each of the sectorial circuit boards to constitute device sections, and constituting a desired electrical circuit together with the sectorial circuit boards;

externally leading electrodes provided at respective innermosts of the sectorial circuit boards;

externally leading terminals which are located at a central part of the disk-shaped circuit board so as to correspond to the externally leading electrodes; and a plurality of mounting holes formed in the heat radiation plate outside the disk-shaped circuit board.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENT

An embodiment of the present invention will now be described, with reference to the accompanying drawings.

Figure 3A:
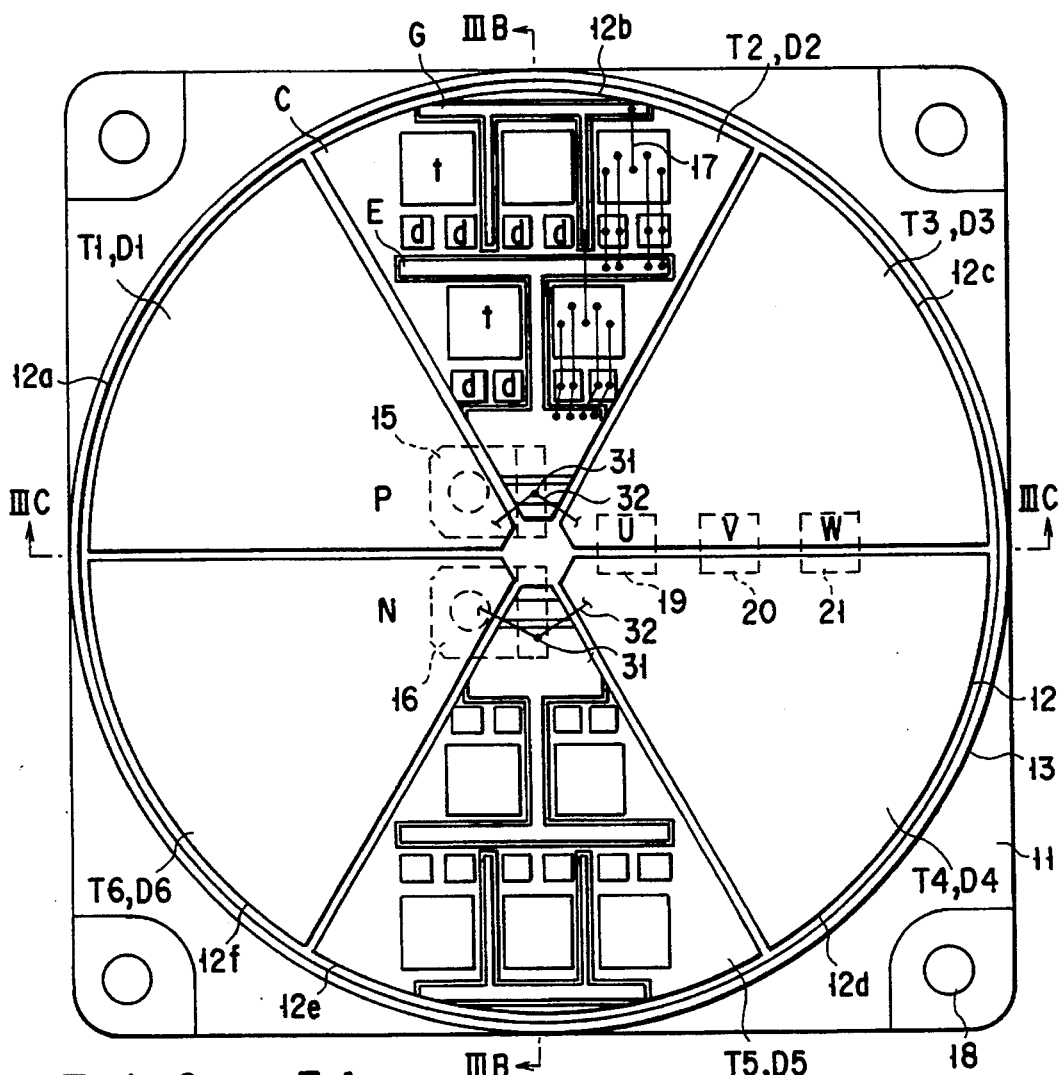
FIG. 3A is a plan view schematically showing a constitution of a high-power three-phase AC motor control module device according to an embodiment of the present invention.
Figure 3B:
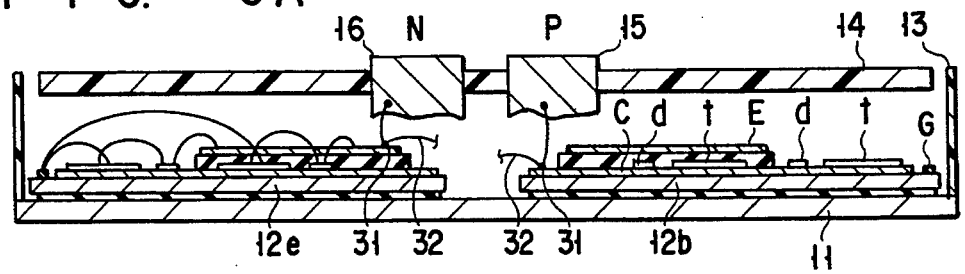
FIG. 3B is a schematic cross-sectional view taken 10 along the line IIIB—IIIB of FIG. 3A.
Figure 3C:
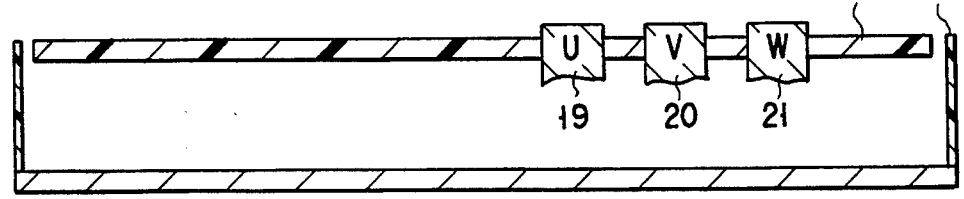
FIG. 3C is a schematic cross-sectional view taken along the line IIIC—IIIC of FIG. 3A.

FIGS. 3A to 3C schematically show a constitution of a high-power three-phase AC motor control module device according to the embodiment of the present invention. Of these figures, FIG. 3A is a plan view of the module device, FIG. 3B is a cross-sectional view taken along the line IIIB—IIIB of FIG. 3A, and FIG. 3C is a cross-sectional view taken along the line IIIC—IIIC of FIG. 3A.

The module device of the present invention comprises a virtually square-shaped heat radiation plate 11, a disk-shaped DBC (Direct Bond Copper) circuit board 12 bonded to the heat radiation plate 11 by solder or the like, a resin case 13 surrounding the DBC circuit board 12, and a resin cover 14 covering the upper surface of the DBC circuit board 12.

The DBC circuit board 12 is constituted by directly adhering a copper plate onto a ceramic insulation substrate by heat and divided into, for example, six sectorial DBC circuit boards 12a to 12f having the same size. On the upper surface of each of the circuit boards 12a to 12f, a circuit pattern of a gate electrode G, an emitter electrode E, a collector electrode C, etc. is formed in advance, and five IGBT pellets t and ten diode pellets d are arranged in a staggered fashion such that they are separated from the central part of the DBC circuit board 12 at substantially the same distance. Furthermore, an externally leading electrode 31 is provided at the innermost of each of the DBC circuit boards 12a to 12f (in the central part of the DBC circuit board 12). The electrodes 31 are interconnected by means of, for example, metallic jumper wires 32.

Figure 1:
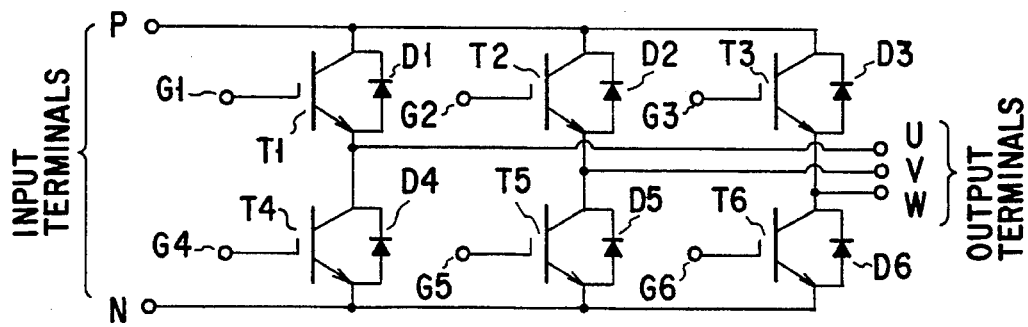
FIG. 1 is a circuit diagram showing a three-phase AC motor control module device serving as an inverter.
Figure 2A:
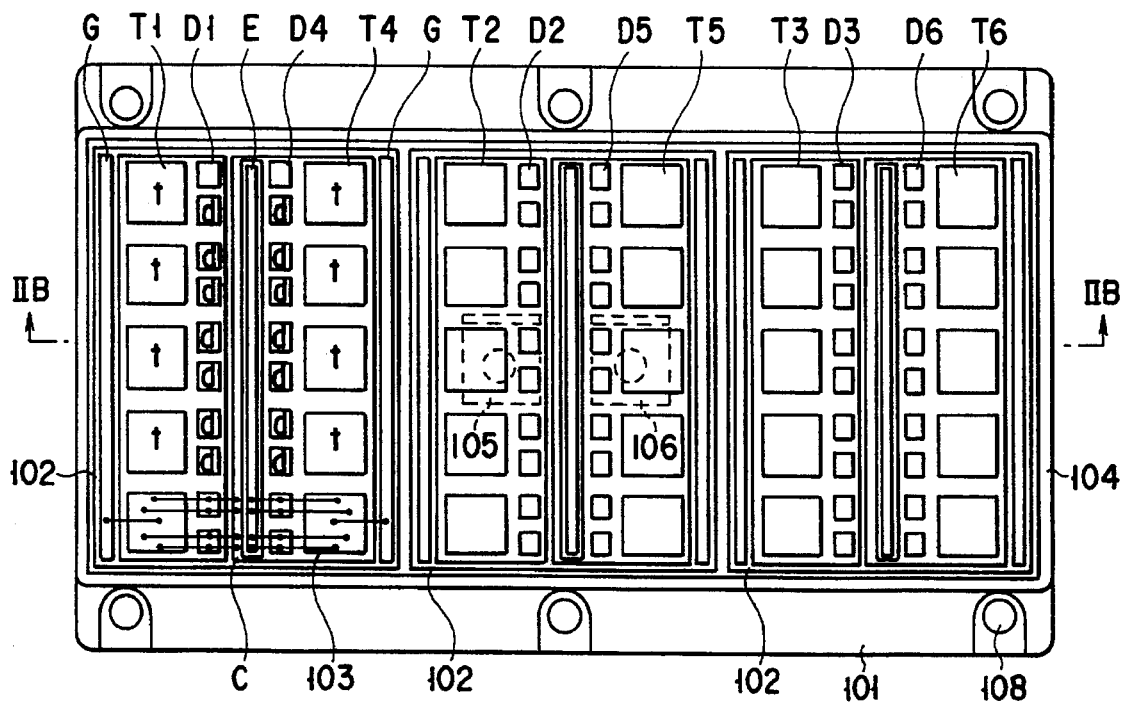
FIG. 2A is a schematic plan view showing a prior art high-power three-phase AC motor control module device, for explaining the drawbacks thereof.
Figure 2B:
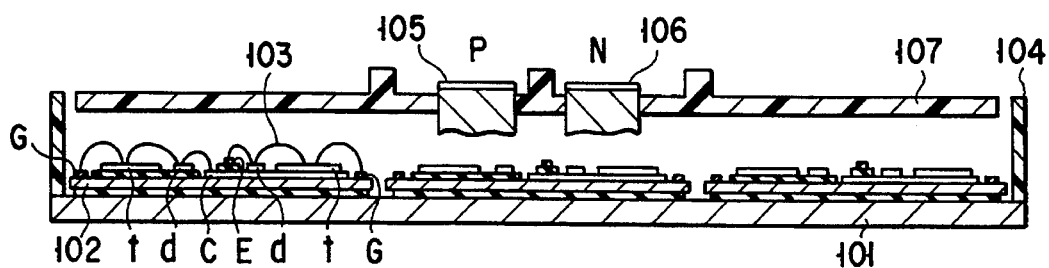
FIG. 2B is a schematic cross-sectional view taken along the line IIB—IIB of FIG. 2A.

The five IGBT pellets t and ten diode pellets d arranged on each circuit board are selectively bonded to the above electrodes by aluminum wires 17, as shown in FIG. 3A. For example, the gates of the IGBT pellets t are connected to the gate electrode G by the aluminum wires 17, and the emitters thereof are connected to the emitter electrode E through the anodes of the diode pellets d by the wires 17. The collectors of the IGBT pellets t and the cathodes of the diode pellets d are electrically connected to the collector electrode C by mounting these pellets t and d on the corresponding sectorial DBC circuit board. Thus, IGBT T1 to T6 and diodes D1 to D6, which constitute device sections as shown in FIG. 1, are formed on the respective sectorial DBC circuit boards 12a to 12f.

According to this embodiment, the device sections alongside an input terminal P (hereinafter referred to as P-side device sections) are formed on the sectorial DBC circuit boards 12a to 12c which are the upper half of the DBC circuit board 12. More specifically, the IGBT T1 and diode D1 are formed on the circuit board 12a, the IGBT T2 and diode D2 are formed on the circuit board 12b, and the IGBT T3 and diode D3 are formed on the circuit board 12c. In contrast, the device sections alongside an input terminal N (hereinafter referred to as N-side device sections) are formed on the sectorial DBC circuit boards 12d to 12f which are the lower half of the DBC circuit board 12 and opposite to the circuit boards 12a to 12c. More specifically, the IGBT T4 and diode D4 are formed on the circuit board 12d, the IGBT T5 and diode D5 are formed on the circuit board 12e, and the IGBT T6 and diode D6 are formed on the circuit board 12f. The collector electrodes C of the DBC circuit boards 12a to 12c on which the P-side device sections are formed, are interconnected by the jumper wires 32. Similarly, the emitter electrodes E of the DBC circuit boards 12d to 12f on which the N-side device sections are interconnected by the jumper wires 32.

The resin case 13 is adhered to the heat radiation plate 11 by a silicon type adhesive so as to be formed along the circumference of the DBC circuit board 12.

Externally leading power terminals (corresponding to the input terminals P and N) 15 and 16 are integrally formed in the central part of the resin cover 14. These power terminals 15 and 16 are used to externally extract the jumper wires 32, which are connected to the power terminals 15 and 16 and interconnect the electrodes 31, from substantially the central part of the resin cover 14 corresponding to the central part of the DBC circuit board 12. The jumper wires 32, which are connected to the collector electrodes C of the circuit boards 12a to 12c in order to interconnect the electrodes 31, are connected to the power terminal 15. Similarly, the jumper wires 32, which are connected to the emitter electrodes E of the circuit boards 12d to 12f in order to connect the electrodes 31, are connected to the power terminal 16.

As described above, the DBC circuit board 12 constituted by the sectorial DBC circuit boards 12a to 12f is shaped like a disk, the externally leading power terminals 15 and 16 are arranged in substantially the central part of the cover 14 corresponding to the central part of the DBC circuit board 12, and the externally leading electrodes 31 are provided at the respective innermosts of the DBC circuit boards 12a to 12f. Therefore, the distances between the power terminals 15 and 16 and the respective DBC circuit boards 12a to 12f can be minimized, with the result that the DBC circuit boards 12a to 12f can be connected to one another without elongating the power terminals 15 and 16 excessively, and the increase in electrical resistance and inductance between the power terminals 15 and 16 and the DBC circuit boards 12a and 12f can be suppressed.

Since, furthermore, the plural pellets t and d are arranged in a staggered fashion on the sectorial DBC circuit boards 12a to 12f, the irregular intervals from the power terminals 15 and 16 to the respective pellets can be improved. Consequently, differences in internal electrical resistance and inductance, which influence the module device in view of the electrical characteristics, can be minimized.

The resin cover 14 is provided with output terminals (U, V and W) 19, 20 and 21 and, more specifically, these output terminals are formed in the cover 14 at the boundary portion between the opposed P- and N-side device sections in such a manner that the distances between the output terminals 19 to 21 and the DBC circuit boards 12a to 12f connected thereto are set to be the shortest. The electrical connection of the output terminals 19 to 21 and the sectorial DBC circuit boards 12a to 12f is accomplished by jumper wires (not shown). For example, the emitter electrode E of the DBC circuit board 12a on which the P-side device section is formed and the collector electrode C of the DBC circuit board 12d on which the N-side device section is formed, are connected to the output terminal 19 by the jumper wires. The emitter electrode E of the DBC circuit board 12b on which the P-side device section is formed and the collector electrode C of the DBC circuit board 12e on which the N-side device section is formed, are connected to the output terminal 20 by the jumper wires. The emitter electrode E of the DBC circuit board 12c on which the P-side device section is formed and the collector electrode C of the DBC circuit board 12f on which the N-side device section is formed, are connected to the output terminal 21 by the jumper wires.

As described above, the P-side device sections connected to the externally leading power terminal 15 are formed on the sectorial DBC circuit boards 12a to 12c and the N-side device sections connected to the externally leading power terminal 16 are formed on the sectorial DBC circuit boards 12d to 12f, and the P-side and N-side device sections are symmetrical with each other. The output terminals 19 to 21 are provided at the boundary portion between the P-side and N-side device sections, and these device sections are connected thereto, with the result that the distances between the output terminals 19 to 21 and the respective DBC circuit boards 12a to 12f can be minimized.

The heat radiation plate 11 also serves as a body of the module device, and screw holes 18 for mounting the device, are formed at the corners of the plate 11 outside the resin case 13. Since, unlike the prior art device, the DBC circuit board 12 is shaped like a disk and has no corners, stress is exerted on the vicinity of the screw holes 18 when the device is mounted, thereby preventing the DBC circuit board from being cracked.

As described above, the plural pellets are arranged in a staggered fashion on each of the sectorial DBC circuit boards of the disk-shaped DBC circuit board. Moreover, the externally leading electrodes are provided at the respective innermosts of the sectorial DBC circuit boards and extracted from the central part of the DBC circuit board outside the device through the externally leading power terminals. Thus, the distances between the respective sectorial DBC circuit boards and the externally leading power terminals can be minimized, and the distances between the externally leading power terminals and the respective pellets on the sectorial DBC circuit boards can be uniformed. Therefore, the electrical resistance and inductance between the sectorial DBC circuit boards and the externally leading power terminals can be decreased, and the efficiency of the module device is greatly improved accordingly. Since, furthermore, the electrical resistance and inductance between the respective pellets can be virtually uniformed, a shift in operation time can be lessened, thereby improving the reliability of the module device.

Moreover, the concentration of stress applied when the module device is mounted, by forming the DBC circuit board like a disk. For this reason, the DBC circuit board can be protected from breakage caused when the module device is mounted.

In the above embodiment, the body of the heat radiation plate is substantially square. However, the body is not limited to this shape. For example, it can be shaped like an ellipse, a trapezoid, or a triangle. If an ellipse- or trapezoid-shaped body is employed, the above-described screw holes have only to be formed at two points outside the resin case surrounding the disk-shaped DBC circuit board. If a triangle-shaped body is employed, the screw holes have only to be formed at three points.

In the above embodiment, the P-side and N-side device sections are arranged opposite to each other. The present invention is not limited to this. For example, the paired P- and N-side device sections can be arranged adjacent to each other, or the P- and N-side device sections are arranged alternately, with the paired P- and N-side device sections facing each other.

In the above embodiment, the disk-shaped DBC circuit board is divided into the sectorial DBC circuit boards, and the plural pellets are arranged in a staggered fashion on each of the sectorial DBC circuit boards. The present invention is not limited to this. For example, the plural pellets can be arranged radially from the central part of the disk-shaped DBC circuit board.

Various changes and modifications can be made without departing from the scope of the subject matter of the present invention.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor module device comprising:

a substantially rectangular heat radiation plate;

a disk-shaped circuit board on said heat radiation plate with an insulator interposed therebetween and divided into a plurality of equal-sized sectorial circuit boards;

a plurality of semiconductor devices arranged in a staggered fashion on each of said sectorial circuit boards to constitute device sections, and constituting a desired electrical circuit together with said sectorial circuit boards;

externally leading electrodes provided at respective innermost locations of said sectorial circuit boards;

externally leading terminals electrically connected to said externally leading electrodes and located at central positions of said disk-shaped circuit board in corresponding relations to said innermost locations of said externally leading electrodes; and a plurality of mounting holes in said heat radiation plate outside said disk-shaped circuit board.

2. The semiconductor module device according to claim 1, wherein said disk-shaped circuit board is a DBC circuit board constituted by bonding a copper plate onto said insulator.

3. The semiconductor module device according to claim 1, wherein said externally leading terminals are in a central part of a resin cover covering an upper surface of said disk-shaped circuit board, and said externally leading terminals and said cover are integral with each other as one component.

* * * * *